(12) United States Patent
Hanson et al.

(10) Patent No.: US 6,700,779 B2
(45) Date of Patent: Mar. 2, 2004

(54) MODULAR FAN UNITS

(75) Inventors: Jeffrey W. Hanson, Redondo Beach, CA (US); Douglas G. Gilliland, Santa Ana, CA (US); Darrell E. Falke, Fullerton, CA (US); Dennis Patrick Miller, Fullerton, CA (US)

(73) Assignee: ADC DSL Systems, Inc., Eden Prairie, MN (US)

( * ) Notice: Subject to any disclaimer, the term of this patent is extended or adjusted under 35 U.S.C. 154(b) by 0 days.

(21) Appl. No.: 10/194,883

(22) Filed: Jul. 12, 2002

(65) Prior Publication Data

US 2004/0012924 A1 Jan. 22, 2004

(51) Int. Cl.[7] .................................................. H05K 7/20
(52) U.S. Cl. ...................................... 361/695; 454/184
(58) Field of Search ................................ 361/678, 695; 454/184

(56) References Cited

U.S. PATENT DOCUMENTS

| | | | | |
|---|---|---|---|---|
| 4,751,872 A | * | 6/1988 | Lawson, Jr. ................ | 454/184 |
| 5,168,171 A | * | 12/1992 | Tracewell .................... | 307/64 |
| 6,236,564 B1 | * | 5/2001 | Fan ............................. | 361/695 |
| 6,283,850 B1 | * | 9/2001 | Toshimitsu et al. .......... | 454/184 |
| 6,304,443 B1 | * | 10/2001 | Chou .......................... | 361/695 |
| 6,317,320 B1 | * | 11/2001 | Cosley et al. ............... | 361/695 |
| 6,337,795 B1 | * | 1/2002 | Wang .......................... | 361/695 |
| 6,476,883 B1 | * | 11/2002 | Salimes et al. ............... | 349/58 |
| 2001/0024358 A1 | * | 9/2001 | Bonet .......................... | 361/695 |
| 2003/0026074 A1 | * | 2/2003 | Clements et al. ........... | 361/695 |
| 2003/0043540 A1 | * | 3/2003 | Chen et al. ................. | 367/687 |

* cited by examiner

Primary Examiner—Harold Joyce
(74) Attorney, Agent, or Firm—Fogg and Associates, LLC; Laura A. Ryan

(57) ABSTRACT

A modular fan unit having a frame receivable within a baffle of a chassis for containing electronic components is provided. Each of a pair of brackets is connected to an end of the frame to form a slot for receiving a wall of the baffle. Moreover, each of the pair of brackets is respectively attachable to a pair of walls of a rack containing the chassis. A fan is attached to the frame so as to align with an aperture located between the pair of brackets and passing through the frame. A controller is attached to the frame and is electrically connected to the fan.

28 Claims, 8 Drawing Sheets

MODULAR FAN UNITS

TECHNICAL FIELD

The present invention relates generally to the field of fans and, in particular, to modular fan units for chassis.

BACKGROUND

Chassis are often used to contain circuit cards, such as circuit cards of telecommunications systems. In telecommunications applications, several chassis for containing circuit cards are, for example, stacked one above the other and are secured in a rack located in a central office or other location. Many of these circuit cards dissipate heat that if not removed from the cards and subsequently from the chassis, can cause the circuit cards to fail.

Many chassis are passively cooled chassis, e.g., heat is removed from the cards and chassis by a natural convection airflow induced by a temperature difference between heated air within the chassis and cooler air outside of the chassis. In one application, outside air is drawn into the chassis through openings at the bottom of the chassis. The air flows generally vertically through the chassis and over the cards so that heat is transferred from the cards to the air, thereby heating the air. The air exits the chassis through openings in the top of the chassis. However, in some stacked arrangements, the heated air flows from the top of one chassis into a chassis above, resulting in reduced heat transfer from the cards of the chassis above. Consequently, baffles are sometimes located atop passively cooled chassis for directing the air flow generally horizontally through the back of one chassis so that the heated air does not flow into a chassis above.

However, the natural convection airflow through some of these passively cooled chassis with baffles does not transfer enough heat from the circuit cards and chassis. Therefore, the circuit cards can overheat and fail. As a result, passively cooled chassis are sometimes replaced by actively cooled chassis, e.g., having fans or other active cooling devices for forcing air through the chassis. However, because many actively cooled chassis include integral active cooling devices, replacement of passively cooled chassis with actively cooled chassis often requires the purchase or fabrication of actively cooled chassis, which is not always cost effective. Moreover, there is not always sufficient space in a rack for a chassis having a fan, so the number of chassis within the rack has to be reduced, which is not always cost effective when renting space within a central office. Replacing passively cooled chassis with actively cooled chassis usually requires the removal of the passively cooled chassis and installation of the actively cooled chassis, which is not always cost effective from a labor standpoint and can result in a disruption of services.

For the reasons stated above, and for other reasons stated below that will become apparent to those skilled in the art upon reading and understanding the present specification, there is a need in the art for equipping existing passively cooled chassis with active cooling devices.

SUMMARY

The above-mentioned problems with replacing passively cooled chassis with actively cooled chassis and other problems are addressed by embodiments of the present invention and will be understood by reading and studying the following specification.

One embodiment provides a modular fan unit having a frame receivable within a baffle of a chassis for containing electronic components. Each of a pair of brackets is connected to an end of the frame to form a slot for receiving a wall of the baffle. Moreover, each of the pair of brackets is respectively attachable to a pair of walls of a rack containing the chassis. A fan is attached to the frame so as to align with an aperture located between the pair of brackets and passing through the frame. A controller is attached to the frame and is electrically connected to the fan.

Another embodiment provides a method for retrofitting a passively cooled chassis for active cooling. The method includes inserting a modular fan unit into a baffle for exhausting fluid from a rear of the chassis so that an aperture of the modular fan unit forms an outlet of the baffle. A fan of the modular fan unit aligns with the aperture and is located within the baffle. Respectively receiving a pair of opposing walls of the baffle within a pair of slots of the modular fan unit is also included in the method. The method includes securing a pair of brackets disposed at opposite ends of the modular fan unit to a pair of walls of a rack containing the chassis. The chassis is diposed between the pair of walls.

Other embodiments are described and claimed.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Embodiments of the present invention provide for retrofitting passively cooled chassis for containing electronic components with a modular fan unit for active cooling. The modular fan unit is received within a baffle of the passively cooled chassis for actively drawing air through the chassis and is attached to a rack containing the chassis. This avoids replacing passively cooled chassis with actively cooled chassis and the above-mentioned problems associated therewith.

Figure 1:
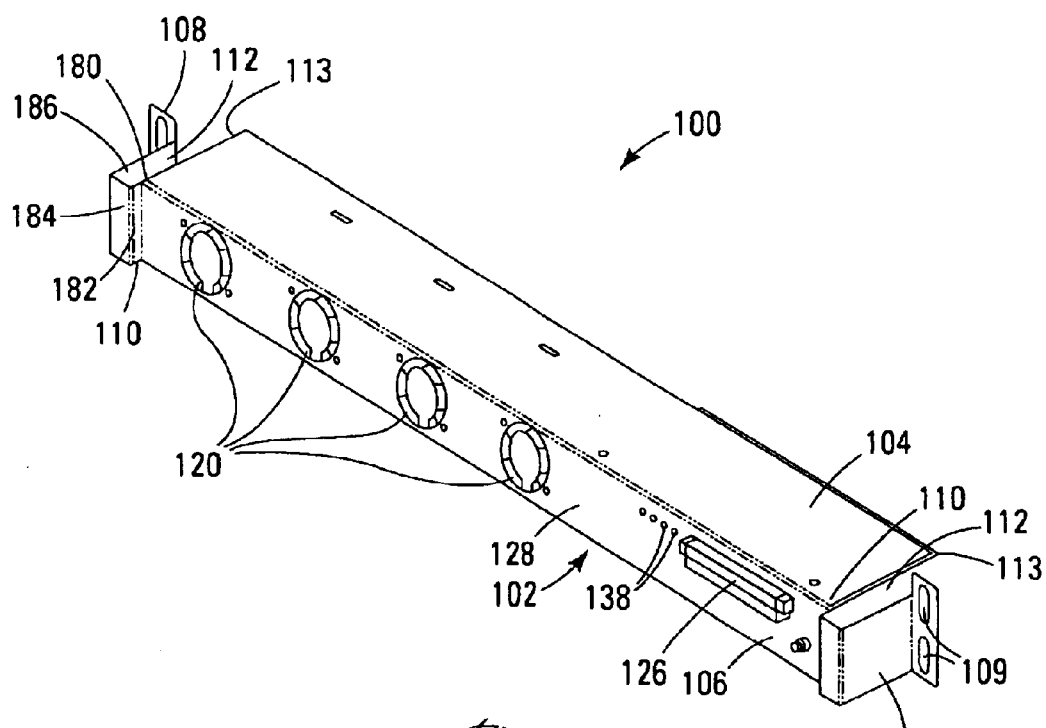
FIG. 1 is an isometric view of an exterior of a modular fan unit according to an embodiment of the present invention.
Figure 2:
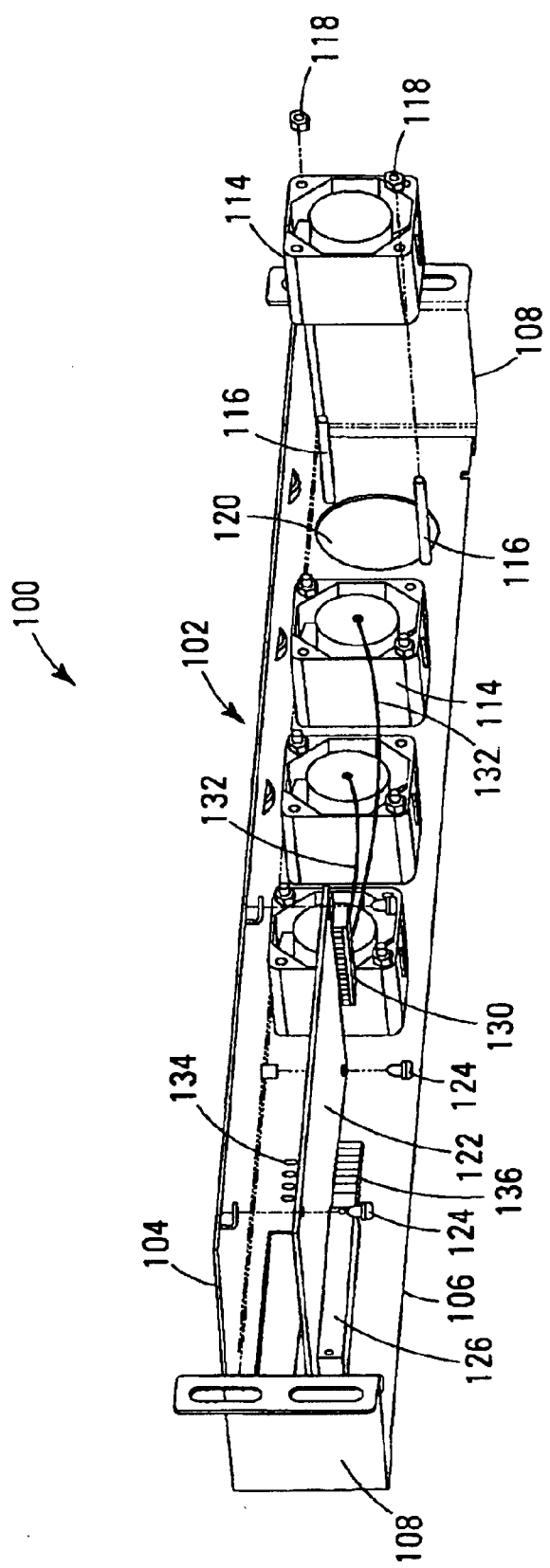
FIG. 2 is an exploded isometric view of an interior of the modular fan unit of FIG. 1.

FIG. 1 is an isometric view of an exterior of a modular fan unit 100 according to an embodiment of the present invention. FIG. 2 is an exploded isometric view of an interior of modular fan unit 100. Modular fan unit 100 has a frame 102 that includes plates 104 and 106. In one embodiment, plate 104 is connected substantially perpendicularly to plate 106. In another embodiment, plates 104 and 106 are integral, as shown in FIGS. 1 and 2, and are of plastic, metal, (e.g., aluminum), or the like.

Brackets 108 are respectively connected to ends 110 of plate 106 to form slots 112. In one embodiment, brackets 108 are integral with plate 106, as shown in FIGS. 1 and 2. In some embodiments, brackets 108 include plates 180 and 182 interconnected by a plate 184 that is substantially perpendicular to plates 180 and 182. In one embodiment, plates 180, 182, and 184 define a socket 186 at an end of slots 112 that, in one embodiment, protrudes from plate 106, as shown in FIG. 1. In another embodiment, slotted apertures 109 pass through brackets 108 to facilitate adjustable mounting of modular fan unit 100, e.g., to a rack for containing chassis for electronic equipment, as described below.

Fans 114 are attached to plate 106, e.g., using studs 116 and nuts 118, as shown in FIG. 2, bolts, cap screws, or the like. Each of fans 114 aligns with an aperture 120 passing through plate 106. A control circuit card 122 is attached to plate 104 using screws 124 or the like, as shown in FIG. 2. An electrical connector 126 of control circuit card 122 passes through plate 106 and, in one embodiment, protrudes from an exterior surface 128 of plate 106, as shown in FIG. 1. Control circuit card 122 also includes an electrical connector 130. Wires 132 electrically interconnect each of fans 114 and electrical connector 130 and thus electrically connect control circuit card 122 to each of fans 114.

Figure 8:
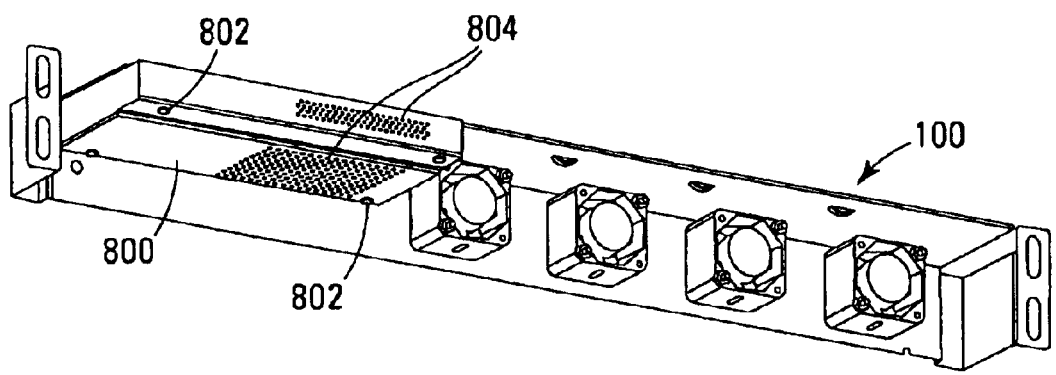
FIG. 8 is an assembled isometric view of an interior of the modular fan unit of FIG. 1 according to another embodiment of the present invention.

In one embodiment, a cover 800 covers control circuit card 122 as shown in FIG. 8, an assembled isometric view of an interior of the modular fan unit of FIG. 1. In another embodiment, fasteners 802, such as cap screws or the like secure cover 800 to control circuit card 122. In some embodiments, cover 800 includes vents 804 for air to flow into and out of the space contained within cover 800 for cooling control circuit card 122. In other embodiments, cover 800 forms a fire enclosure and is of a fire resistant material, such as metal or the like.

Control circuit card 122 receives power, e.g., from a battery or other power source, via electrical connector 126. Control circuit card 122 transmits the power to each of fans 114 via electrical connector 130 and wires 132. In some embodiments, control circuit card 122 monitors operation of fans 114 and transmits an alarm signal via electrical connector 126 when an alarm condition is detected, e.g., a fan failure. A number of visual indicators 134, such as light emitting diodes, are connected to control circuit card 122 by a connector 136, as shown in FIG. 2. In one embodiment, each of visual indicators 134 respectively aligns with each apertures 138 passing through plate 106. Visual indicators 134 indicate the status of fans 114. For example, in some embodiments, one of visual indicators 134 lights when control circuit card 122 is receiving power, another lights when one or more of fans 114 fails, etc.

Figure 3:
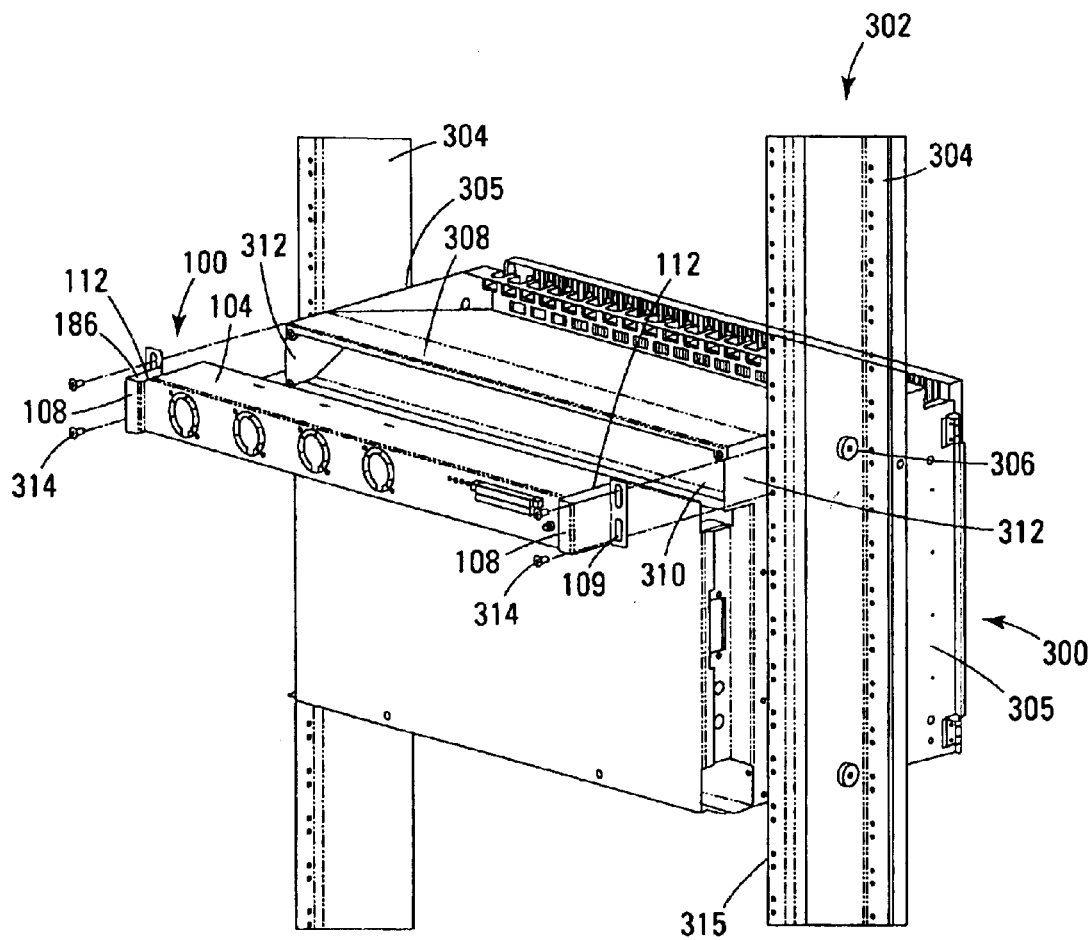
FIG. 3 is an exploded isometric back view of a chassis retrofitted with a modular fan unit according to another embodiment of the present invention.

In one embodiment, modular fan unit 100 is for retrofitting passively cooled chassis for containing electronic components, such as electronic circuit cards, for active cooling. FIG. 3 is an exploded isometric back view of a chassis 300 retrofitted with modular fan unit 100 according to another embodiment of the present invention. In one embodiment, chassis 300 contains telecommunications electronic circuit cards, such as HDSL, HDSL2, T1 repeater, etc. Chassis 300 is mounted in a rack 302. In particular, chassis 300 is disposed between walls 304 of rack 302, and opposing sides 305 of chassis 300 are attached to walls 304 by fasteners 306, such as cap screws or the like. A baffle 308 is mounted atop chassis 300. Prior to retrofitting chassis 300 with modular fan unit 100, chassis 100 is passively cooled. During passive cooling, a natural convection flow passes through chassis 300 and is exhausted at the rear of chassis 300 by baffle 308.

Retrofitting chassis 300 for active cooling includes receiving plate 104 of modular fan unit 100 within baffle 308 through an outlet 310 of baffle 308. As plate 104 is received in baffle 308, opposing walls 312 of baffle are received in slots 112 of modular fan unit 100. Brackets 108 are respectively secured to walls 304 of frame 302 using fasteners 314, e.g., cap screws or the like. In one embodiment, fasteners 314 pass through the slotted apertures 109 in brackets 108 and thread into apertures 315 of rack 302. In some embodiments, slotted apertures 109 facilitate adjustable mounting of modular fan unit 100 to rack 302 for positioning modular fan unit 100 within baffle 308. In other embodiments, slotted apertures 109 accommodate a range of distances between the apertures 315 of one of walls 304.

Figure 4:
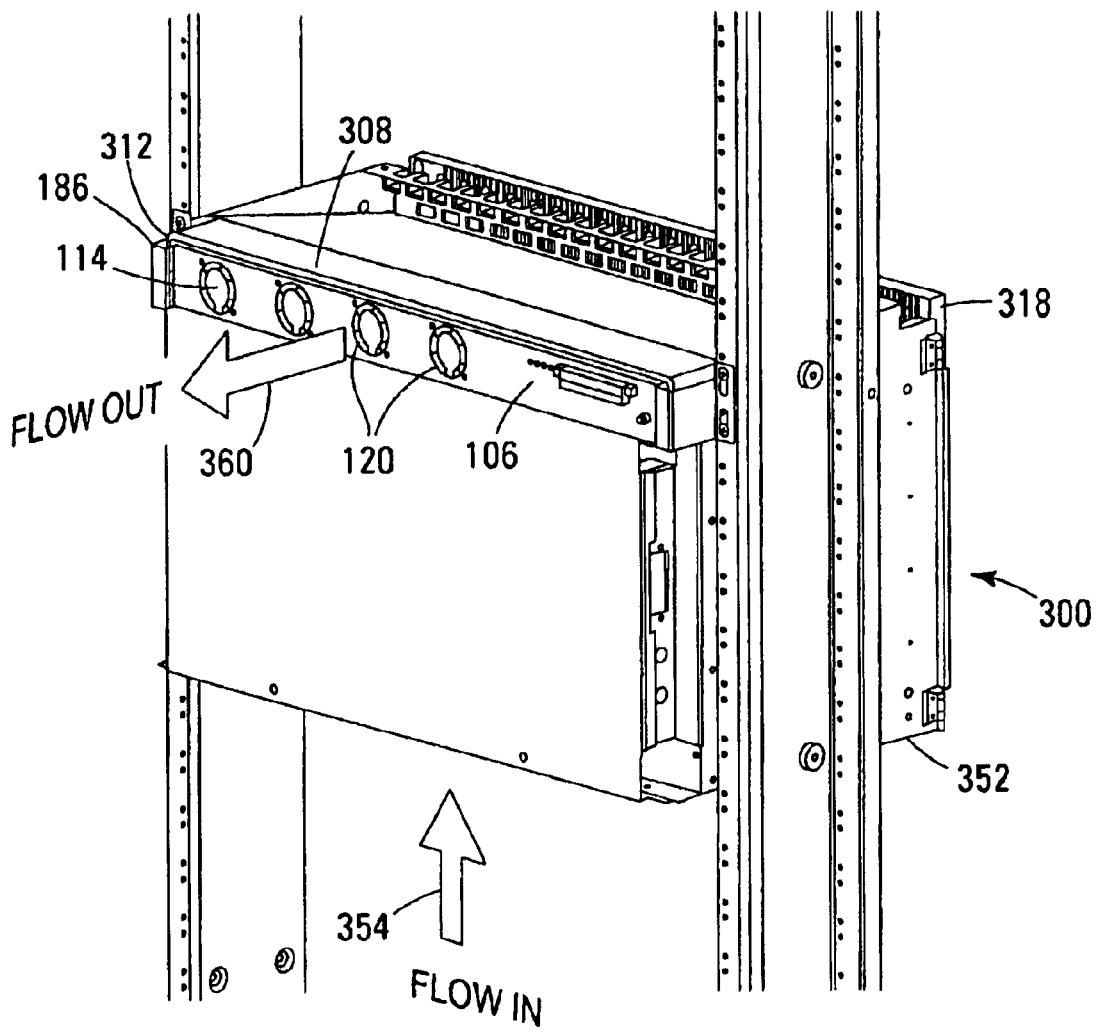
FIG. 4 is an assembled isometric back view chassis of FIG. 3.
Figure 5:
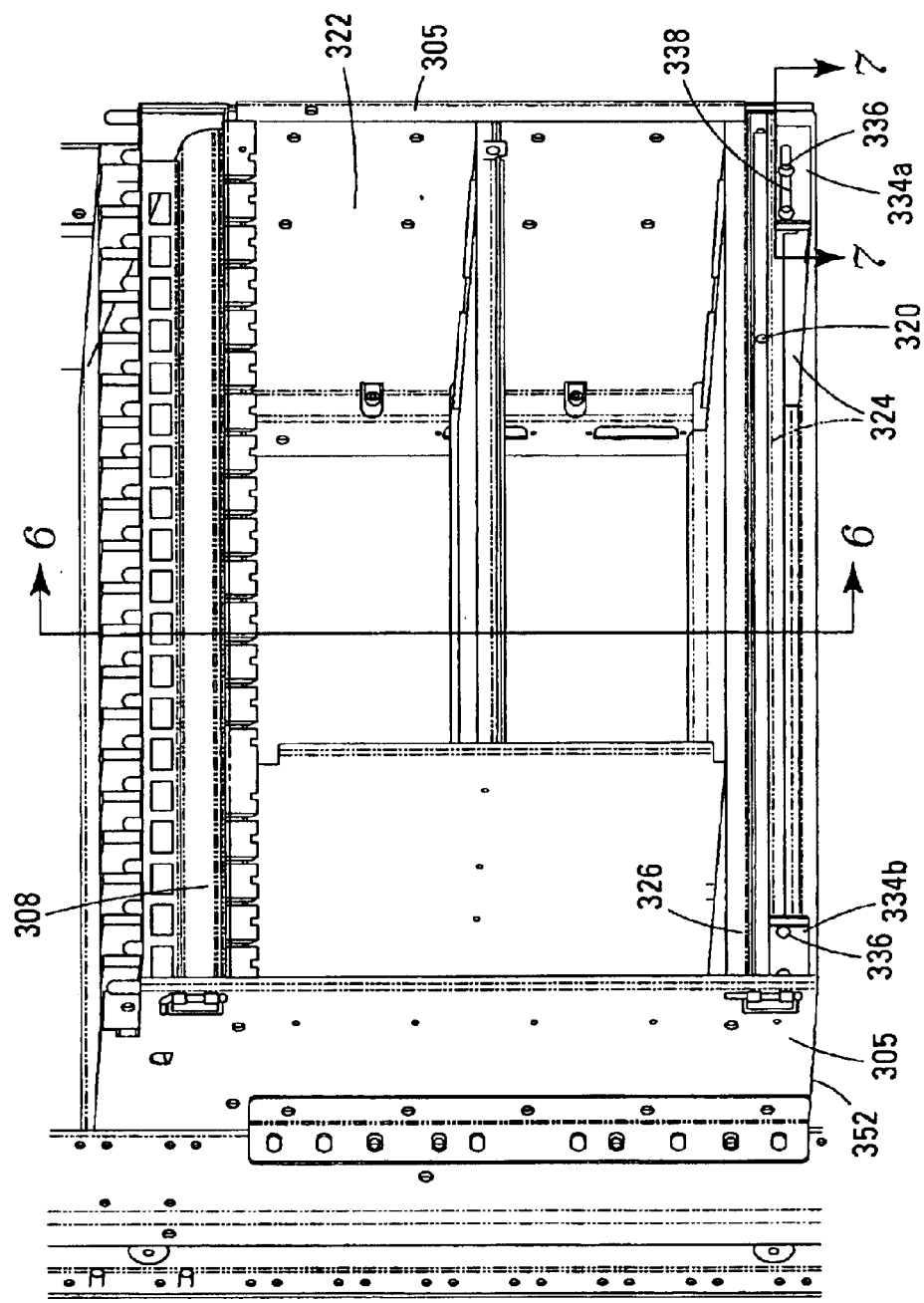
FIG. 5 is an assembled isometric front view of chassis of FIG. 3.
Figure 6:
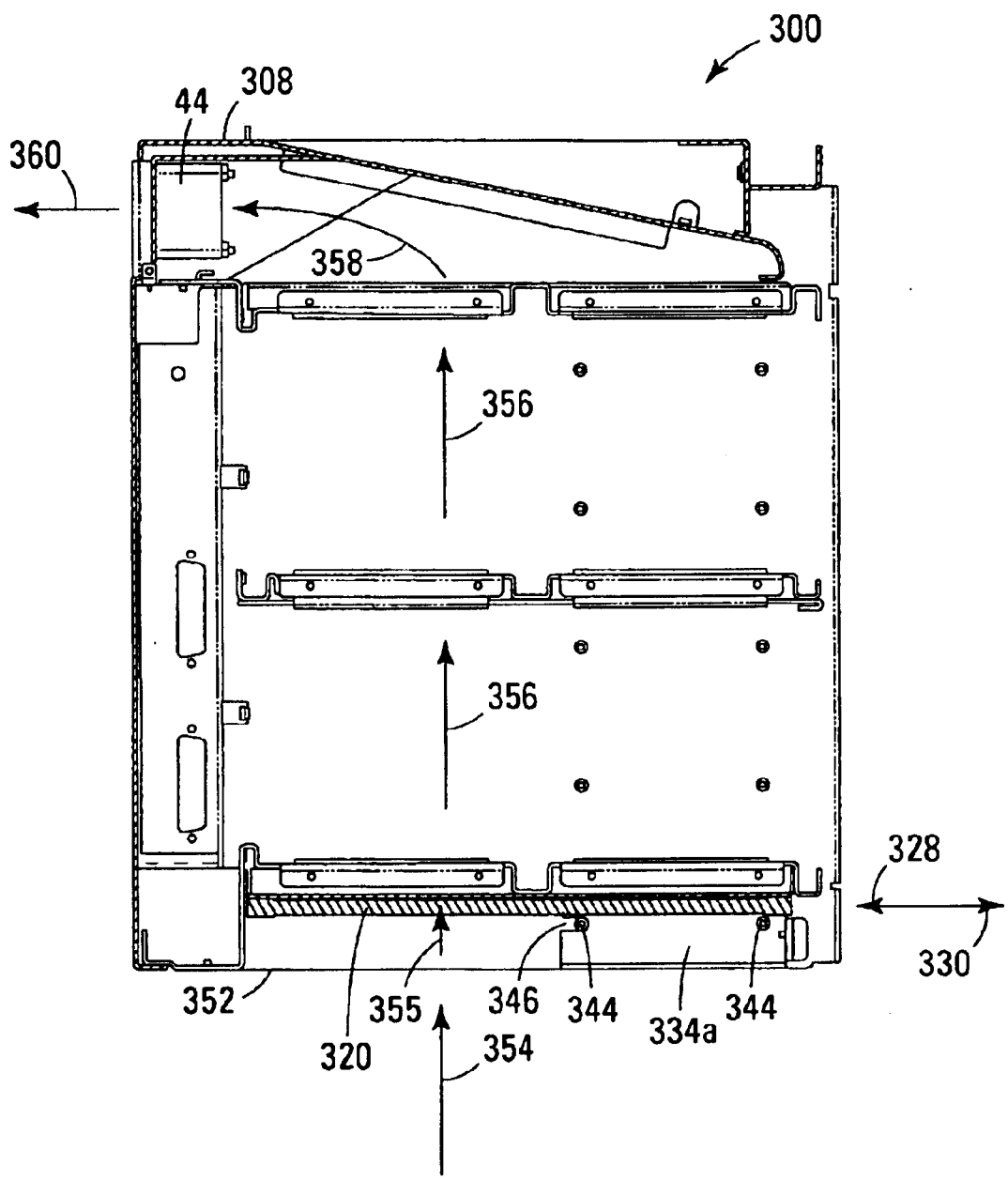
FIG. 6 is a view taken along line 6—6 of FIG. 5.

FIG. 4 is an assembled isometric back view of chassis 300 retrofitted with modular fan unit 100. FIG. 5 is an assembled isometric front view of chassis 300 with a cover 318 (shown in FIG. 4) removed, and FIG. 6 is a view taken along line 6—6 of FIG. 5. Apertures 120 form an outlet of baffle 308, as shown in FIG. 4, and fans 114 are located within baffle 308, as shown in FIG. 6. Although not shown, controller circuit card 122 is also located within baffle 308. In one embodiment, walls 312 of baffle 308 are received within sockets 186 located at the end of slots 112. In another embodiment, this causes plate 106 to be recessed within baffle 308, as shown in FIG. 4. In some embodiments, a filter 320 is located adjacent a bottom 352 of chassis 300 opposite baffle 308 so that an interior 322 of chassis 300 is between filter 320 and baffle 308, as shown in FIG. 5. In one embodiment, filter 320 is disposed between a filter frame 324 and a lower shelf 326 of chassis 300, as shown in FIG. 5. In another embodiment, filter slides into and out of chassis 300 through the front of chassis 300, as respectively indicated by arrowheads 328 and 330 in FIG. 6.

Figure 7:
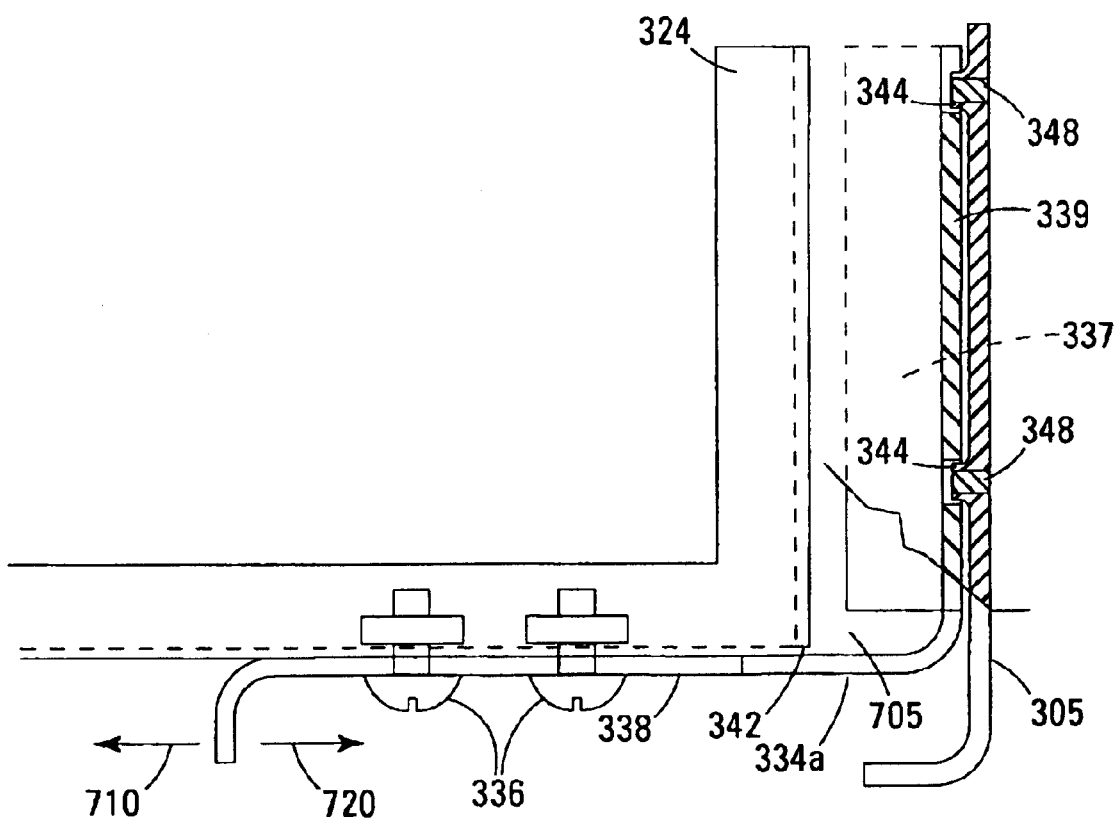
FIG. 7 is a cross-sectional view taken along line 7—7 of FIG. 5.

Brackets 334a and 334b secure filter frame 324 within chassis 300. Fasteners 336, such as nuts and bolts, cap screws, or the like, attach brackets 334 to filter frame 324. In one embodiment, at least one of brackets 334, e.g., bracket 334a as shown in FIG. 5 and FIG. 7, a cross-sectional view taken along line 7—7 of FIG. 5, includes a slot 338 for receiving fasteners 336. Slot 338 enables bracket 334a to be adjustably positioned relative to filter frame 324 and adjacent side 305 of chassis 300, as indicated by arrowheads 710 and 720 in FIG. 7. In one embodiment, bracket 334a is adjustably positioned to extend across a gap 705 between filter frame 324 and side 305 so as to connect side 305 to filter frame 324. In yet another embodiment, a flange 337 is attached to an edge 339 of each brackets 334 and, in one embodiment, extends into gap 705, as illustrated for bracket 334a in FIG. 7.

In one embodiment, brackets 334 are substantially "L" shaped so as to wrap around a corner 342 of filter frame 324, as shown in FIG. 7. In another embodiment, extrusions 344 of side 305 extend through brackets 334, as shown for bracket 334a in FIGS. 6 and 7. In one embodiment, at least one of extrusions 344 passes through a slotted aperture 346 in brackets 334, as shown for bracket 334a in FIG. 6. In some embodiments, apertures 348 pass through extrusions 344. In another embodiment, apertures 348 are threaded, as shown in FIG. 7.

During operation, fans 114 draw air into chassis 300 through bottom 352 of chassis 300, as indicated by arrow 354 in FIGS. 4 and 6. In one embodiment, the air flows through filter 320, as indicated by arrow 355 in FIG. 6. The air flows through chassis 300, as indicated by arrows 356 in FIG. 6, and heat is transferred to the air from the circuit cards (not shown) within chassis 300. The air flows into baffle 308, and baffle 308 directs the flow substantially perpendicularly so as to direct the flow into fans 114, as indicated by arrow 358 in FIG. 6. The air passes through fans 114 and exits baffle 308 at the rear of chassis 300 through apertures 120, as indicated by arrow 360 in FIGS. 4 and 6.

Conclusion

Embodiments of the present invention have been described. The embodiments provide for retrofitting passively cooled chassis for containing electronic components with a modular fan unit for active cooling. The modular fan unit is received within a baffle of the passively cooled chassis for actively drawing air through the chassis and is attached to a rack containing the chassis. This avoids replacing passively cooled chassis with actively cooled chassis.

Although specific embodiments have been illustrated and described in this specification, it will be appreciated by those of ordinary skill in the art that any arrangement that is calculated to achieve the same purpose may be substituted for the specific embodiment shown. This application is intended to cover any adaptations or variations of the present invention. It is manifestly intended that this invention be limited only by the following claims and equivalents thereof.

What is claimed is:

1. A modular fan unit comprising:
   a frame receivable within a baffle of a chassis for containing electronic components;
   a pair of brackets, each of the pair of brackets connected to an end of the frame to form a slot for receiving a wall of the baffle, each of the pair of brackets respectively attachable to a pair of walls of a rack containing the chassis;
   a fan attached to the frame so as to align with an aperture located between the pair of brackets and passing through the frame; and
   a controller attached to the frame and electrically connected to the fan.

2. The modular fan unit of claim 1, wherein the fan comprises a plurality of fans.

3. The modular fan unit of claim 1, further comprising at least one visual indicator electrically connected to the controller and aligned with another aperture passing through the frame.

4. The modular fan unit of claim 1, wherein the controller supplies power to the fan.

5. The modular fan unit of claim 1, wherein the controller monitors operation of the fan.

6. The modular fan unit of claim 1, wherein the aperture forms an outlet of the baffle when the frame is received in the baffle.

7. The modular fan unit of claim 1, wherein an electrical connector of the controller protrudes from an exterior surface of the frame.

8. A modular fan unit comprising:
   a frame having first and second plates, the first plate connected substantially perpendicularly to the second plate, wherein the first plate is receivable within a baffle of a chassis for containing electronic components so that an aperture passing through the second plate forms an outlet of the baffle;
   a pair of brackets, each of the pair of brackets connected to an end of the second plate to form a slot for receiving a wall of the baffle, each of the pair of brackets respectively attachable to a pair of walls of a rack containing the chassis; and
   a fan attached to the second plate so as to align with the aperture.

9. The modular fan unit of claim 8, wherein the fan comprises a plurality of fans.

10. The modular fan unit of claim 8, further comprising a controller attached to the frame and electrically connected to the fan.

11. The modular fan unit of claim 10, wherein the controller supplies power to the fan.

12. The modular fan unit of claim 10, wherein the controller monitors operation of the fan.

13. The modular fan unit of claim 10, wherein an electrical connector of the controller protrudes from an exterior surface of the second plate.

14. The modular fan unit of claim 8, further comprising a visual indicator aligned with another aperture passing through the second plate.

15. The modular fan unit of claim 14, wherein the visual indicator is a light emitting diode.

16. A method for retrofitting a passively cooled chassis for active cooling, the method comprising:
   inserting a modular fan unit into a baffle for exhausting fluid from a rear of the chassis so that an aperture of the modular fan unit forms an outlet of the baffle, wherein a fan of the modular fan unit aligns with the aperture and is located within the baffle;
   respectively receiving a pair of opposing walls of the baffle within a pair of slots of the modular fan unit; and
   securing a pair of brackets disposed at opposite ends of the modular fan unit to a pair of walls of a rack containing the chassis, the chassis disposed between the pair of walls.

17. The method of claim 16, further comprising electrically connecting the modular fan unit to a power source via an electrical connector protruding from the modular fan unit, wherein the electrical connector is attached and electrically connected to a controller electrically connected to the fan.

18. The method of claim 16, further comprising disposing a filter on the chassis opposite the baffle so that an interior of the chassis is between the baffle and the filter.

19. A method for manufacturing a modular fan unit, the method comprising:
   forming a frame, the frame receivable within a baffle of a chassis for containing electronic components;
   passing an aperture through the frame, wherein when the frame is received in the baffle, the aperture forms an outlet of the baffle;
   respectively forming each of a pair of brackets at each of a pair of opposing ends of the frame, wherein each of a pair of brackets is respectively attachable to each of a pair of walls respectively attached to opposing sides of the chassis;
   forming each of a pair of slots respectively between each of the brackets and each of the pair of opposing ends for respectively receiving each of a pair of opposing walls of the baffle; and attaching a fan to the frame so that a fan aligns with the aperture.

20. The method of claim 19, further comprising electrically connecting a controller to the fan.

21. The method of claim 20, further comprising electrically connecting a visual indicator to the controller.

22. The method of claim 19, further comprising forming another aperture through the frame and aligning a visual indicator with the another aperture.

23. An electronics rack comprising:

a pair of walls;

a chassis for containing electronic circuit cards disposed between the pair of walls, the chassis having a baffle located at a first end of the chassis and a filter located at a second end of the chassis, the second end opposite the first end; and a modular fan unit disposed between the pair of walls, wherein the modular fan unit comprises:
  a frame located within a baffle of the chassis,
  a pair of brackets, each of the pair of brackets connected to an end of the frame to form a slot that contains a wall of the baffle, each of the pair of brackets respectively attached to the pair of walls;
  a fan attached to the frame so as to align with an aperture located between the pair of brackets and passing through the frame, the aperture forming an outlet of the baffle; and
  a controller attached to the frame and electrically connected to the fan.

24. The electronics rack of claim 23, wherein the fan comprises a plurality of fans.

25. The electronics rack of claim 23, further comprising at least one visual indicator electrically connected to the controller and aligned with another aperture passing through the frame.

26. The electronics rack of claim 23, wherein the controller supplies power to the fan.

27. The electronics rack of claim 23, wherein the controller monitors operation of the fan.

28. The electronics rack of claim 23, wherein an electrical connector of the controller protrudes from an exterior surface of the frame.

* * * * *